US007027129B2

(12) United States Patent
Kremer et al.

(10) Patent No.: US 7,027,129 B2
(45) Date of Patent: Apr. 11, 2006

(54) SYSTEM FOR LASER BEAM EXPANSION WITHOUT EXPANDING SPATIAL COHERENCE

(75) Inventors: Alexander Kremer, Stamford, CT (US); Stanley W. Drazkiewicz, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 4 days.

(21) Appl. No.: 10/947,347

(22) Filed: Sep. 23, 2004

(65) Prior Publication Data

US 2005/0036125 A1 Feb. 17, 2005

Related U.S. Application Data

(63) Continuation of application No. 10/208,046, filed on Jul. 31, 2002, now Pat. No. 6,801,299.

(51) Int. Cl.
*G03B 27/54* (2006.01)
*G03B 27/72* (2006.01)

(52) U.S. Cl. .......................................... 355/67; 355/71
(58) Field of Classification Search ................. 355/67, 355/71; 359/618, 617, 629, 633, 850, 857, 359/861; 372/25
See application file for complete search history.

(56) References Cited

U.S. PATENT DOCUMENTS

| 4,362,361 | A | 12/1982 | Campbell et al. ............ 359/629 |
| 4,765,715 | A | 8/1988 | Matsudaira et al. ......... 359/583 |
| 4,925,271 | A | 5/1990 | Taniura ...................... 359/629 |
| 4,997,261 | A | 3/1991 | Taniura ...................... 359/495 |
| 5,005,969 | A | 4/1991 | Kataoka |
| 5,089,711 | A | 2/1992 | Morsell et al. |
| 5,165,080 | A | 11/1992 | Healey ....................... 359/636 |
| 5,224,200 | A | 6/1993 | Rasmussen et al. |
| 5,343,489 | A | 8/1994 | Wangler |
| 5,825,551 | A | 10/1998 | Clarkson et al. ............ 359/629 |
| 6,275,514 | B1 | 8/2001 | Katzir et al. |
| 6,801,299 | B1 | 10/2004 | Kremer et al. |
| 6,819,402 | B1 | 11/2004 | Augustyn et al. |
| 2005/0083505 | A1 | 4/2005 | Augustyn et al. |

FOREIGN PATENT DOCUMENTS

EP 1304595 4/2003

OTHER PUBLICATIONS

European Communication from European Patent Application No. 03 017 268.8, dated Nov. 11, 2004, 6 pages.

(Continued)

*Primary Examiner*—Rodney Fuller
(74) *Attorney, Agent, or Firm*—Sterne, Kessler, Goldstein & Fox P.L.L.C

(57) ABSTRACT

An system and method that expand emitted light from a laser beam without changing spatial coherence or producing speckle. The system includes a laser source and an optical projection system having a multiplexing device. The multiplexing device expands light emitted by laser source into plural beams having light intensity about equal to each other without changing spatial coherence. The multiplexing device has a plurality of spatially separated beam splitters positioned parallel to and on a same side of a mirror. The system further includes an illuminating optical system that focuses each of the plural beams and a projection optical system that projects an image of a mask illuminated with light output from illuminating optical system onto a substrate.

8 Claims, 6 Drawing Sheets

OTHER PUBLICATIONS

Copy of Australian Search Report for Appl. No. 200303906-2, mailed Sep. 29, 2004.

Copy of European Search Report for Appl. No. EP 03 01 7268, mailed Dec. 4, 2003, 3 pgs.

Written Opinion from Singapore Patent Application No. 200303906-2, 5 pages, dated Apr. 21, 2005.

SYSTEM FOR LASER BEAM EXPANSION WITHOUT EXPANDING SPATIAL COHERENCE

CROSS REFERENCE TO RELATED APPLICATIONS

This application is a continuation of U.S. application Ser. No. 10/208,046, filed Jul. 31, 2002 (now U.S. Pat. No. 6,801,299 that issued Oct. 5, 2004), which is incorporated by reference herein in its entirety.

BACKGROUND OF THE INVENTION

1. Field of the Invention

The invention relates to a system and method for expanding a laser beam without expanding its spatial coherence.

2. Background Art

In lithography, or other environments (e.g., holography), expansion of an excimer laser beam or deep UV (DUV) excimer laser beam is necessary because an illumination system field is typically much bigger than the laser beam. Typically, laser beams are 10 mm×10 mm or 5 mm×20 mm, while an illumination field may be 120 mm×25 mm. Although the laser beam is described as having a rectangular or square cross-section, various cross-sections of light can be used. Generally, lithography devices use an arrangement consisting of one reflector and one partial reflector (or beam splitter) to preliminarily expand the laser beam in an optical multiplexer before expanding the preliminarily expanded beam further in other parts of the lithography tool. Unfortunately, expansion with typical optical devices (lenses, prisms) increases the spatial coherence of the laser and creates a speckle problem. Therefore, other optical devices can be used. The drawback of using the reflector/beam splitter arrangement is that it requires a complicated design of a "staircase" partial reflector, which consists of patches of coatings having a stepwise change in reflectivity based on predetermined parameters. This arrangement requires an exact match of the size and position of the laser beam and the "staircase" patch pattern. Also, a practical implementation of the "staircase" partial reflector leads to uncoated areas between the patches and the expanded beam, which results in a "zebra" pattern with dark areas cutting through bright areas of a beam cross section. Further, excimer lasers have a tendency to change the beam size and divergence over the time.

Therefore, a system and method for expanding an emitted light from a laser without changing spatial coherence of the light, without producing speckle patterns, and that eliminates the requirement for the "staircase" partial reflectors is needed.

BRIEF SUMMARY OF THE INVENTION

Embodiments of the invention provide an optical system comprising a laser source and a multiplexing device. The multiplexing device has a plurality of spatially separated beam splitters positioned parallel to and on a same side of a mirror. The multiplexing device expands light emitted by laser source into plural beams having light intensity substantially equal to each other without changing spatial coherence. The optical system further comprises an illuminating optical system that focuses each of the plural beams and a projection optical system that projects an image of a mask illuminated with light output from illuminating optical system onto a substrate.

Other embodiments of the invention provide a light multiplexing device comprising a reflector and a plurality of spatially separated beam splitters positioned on a same side of and parallel to the reflector. The multiplexer expands light emitted by a laser source into a plurality of beams having light intensity substantially equal to each other without changing a spatial coherence of light emitted by laser.

Some advantages provided by the embodiments of the invention are that a laser beam is expanded without changing its spatial coherence and without producing speckle patterns through the use of uniform partial reflectors that are much easier to manufacture and produce than "staircase" beam splitters. Another advantage is that it is less critical that the laser beam be accurately aligned with respect to beam splitters, which is critical in the previous devices.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated in and constitute a part of the specification, illustrate an embodiment(s) of the invention and, together with the description, explain the purpose, advantages, and principles of the invention.

In the drawings, most like reference numbers indicate the same or substantially the same elements. Furthermore, the left-most digit(s) of the reference numbers indicate the number of the drawing in which the reference number is first used.

DETAILED DESCRIPTION OF THE INVENTION

Figure 1:
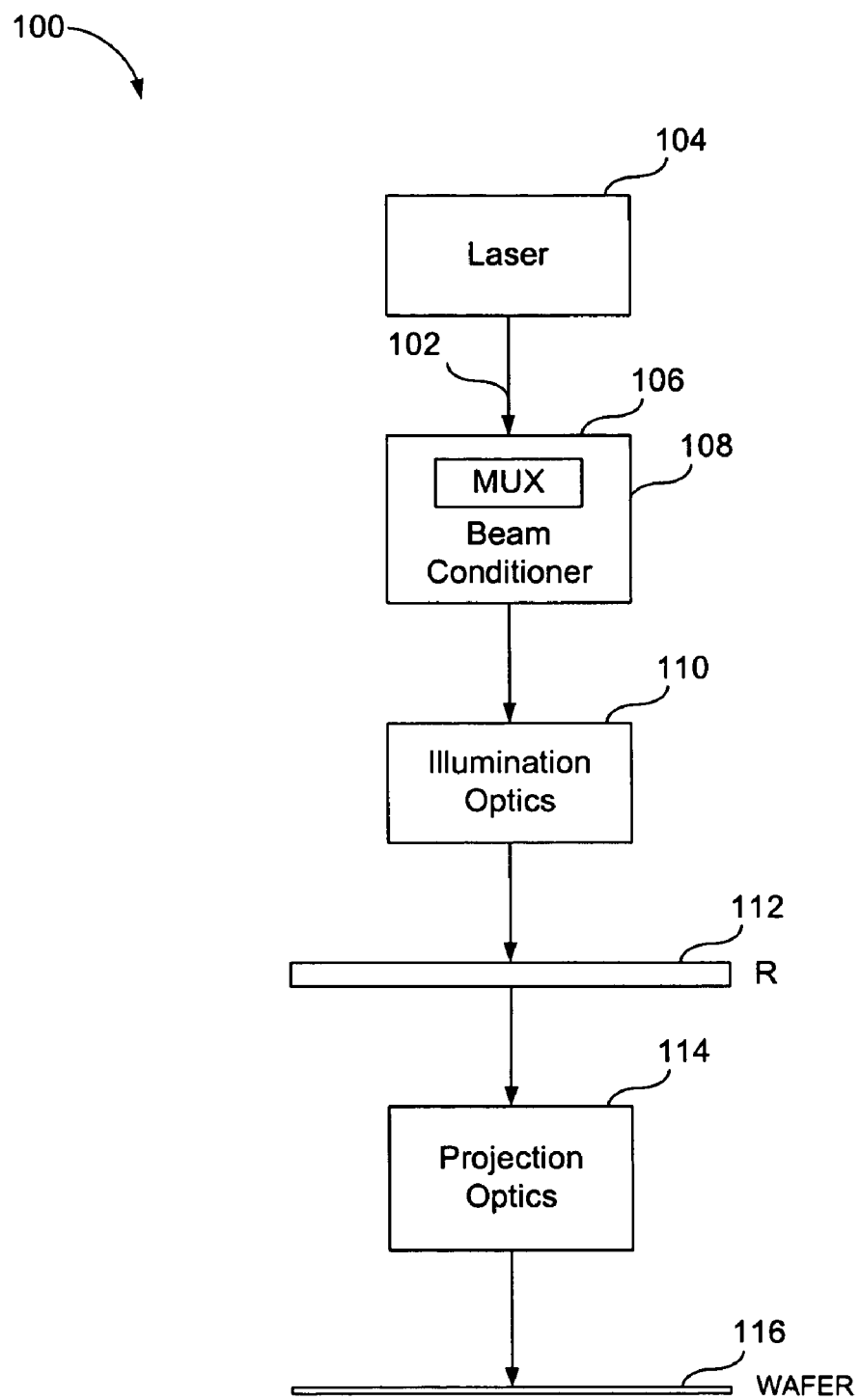
FIG. 1 depicts an optical system according to an embodiment of the invention.

A system 100 for expanding light 102 emitted from a laser 104 without changing spatial coherence of the light 102 and that substantially eliminates speckle patterns is shown in FIG. 1. The laser 104 can be an excimer or deep UV excimer laser. The light 102 is received by a multiplexer 106 in a beam conditioner 108. The beam conditioner 108 outputs light to illumination optics 110, which in turn transmits light through a mask or reticle 112 onto a substrate 116 via projection optics 114. One embodiment for this system can be a lithography system, or the like. Another embodiment can be a holography system. Although expansion is performed by multiplexer 106, multiplexer 106 can be a pre-expansion system or first expansion system that expands the light about four to six times, while further expansion can be carried out by other optics in system 100. By using the pre-expansion system 106, speckle and other problems related to conventional expansion system can be substantially eliminated.

Figure 2A:
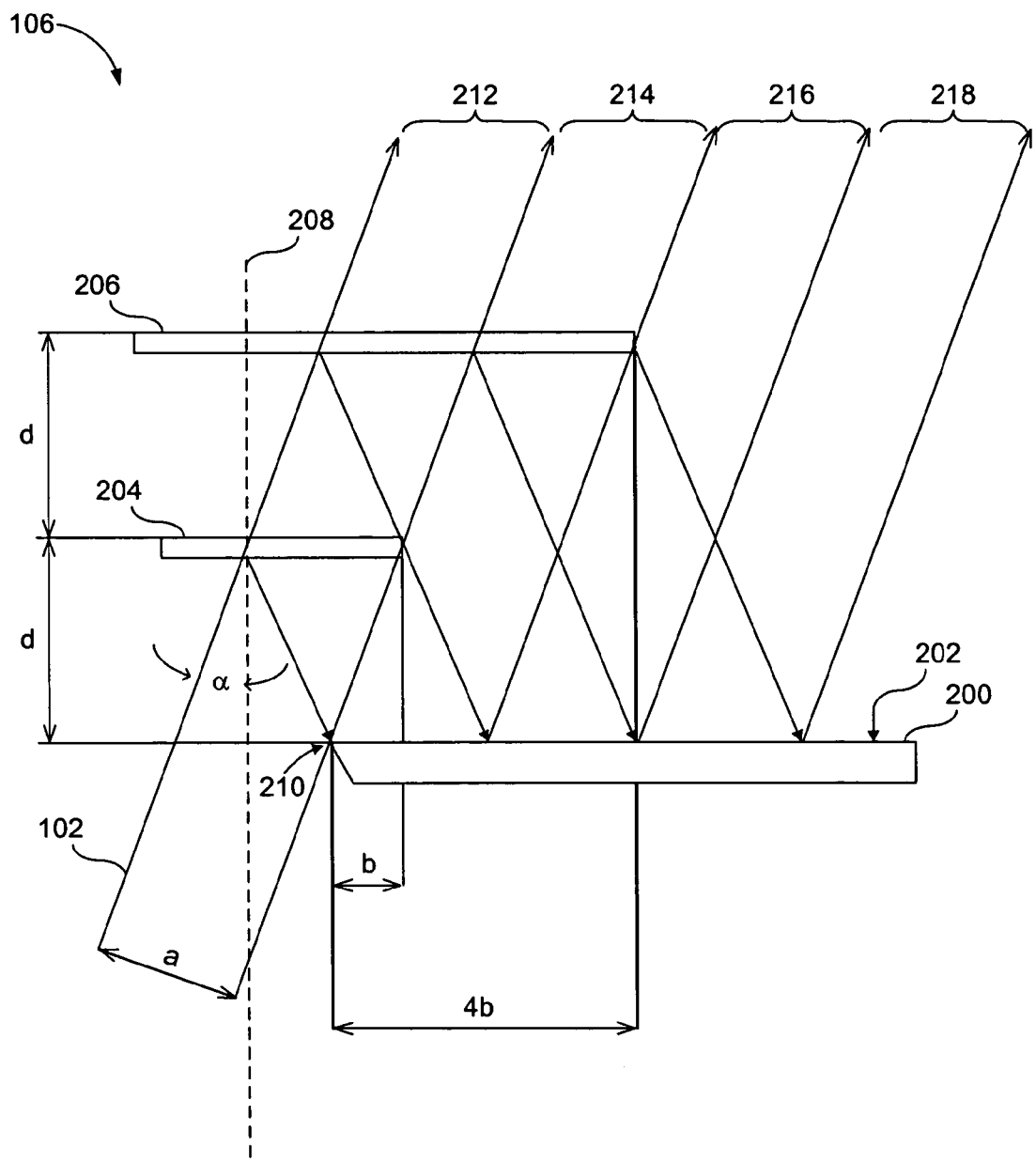
FIGS. 2A–2B depict optical multiplexer elements and light travel within a portion of the optical system in FIG. 1, according to embodiments of the present invention.

Turning to FIG. 2A, an embodiment of the multiplexer 106 is shown. The multiplexer 106 comprises a reflector 200 with a reflecting surface 202 that lies in a plane extending from the reflecting surface 202. First and second beam splitters 204 and 206, which can be 50/50 or any other ratio beam splitters having a multilayer dielectric coating than can produce expanded beams with about equal intensities, are located on a same side of the reflector 200 and lie in planes that are parallel to the plane extending from the reflecting surface 202. A distance d between the reflector 200 and the first beam splitter 204 is equal to a same distance d between the first beam splitter 204 and the second beam splitter 206. The distance d is defined by an angle $\alpha$, which is an angle the light 102 intersects an axis of symmetry 208 of the first beam splitter 204, and a width a of the beam 102 according to the following formula:

$$d = a/(2 * \sin \alpha). \quad (1)$$

Also, angle $\alpha$, the width a of the beam 102, and the temporal coherence length L of the laser 104, are related according to the following formula:

$$\tan \alpha < a/L. \quad (2)$$

Further, the first beam splitter 204 is laterally shifted by b and the second beam splitter 206 is laterally shifted by 4b relatively to an edge 210 of the reflector 200, where:

$$b = d * \tan \alpha. \quad (3)$$

Ideally, angle $\alpha$ is much smaller than a/L. In some embodiments, a value for angle $\alpha$ would be chosen and the other parameters would be calculated based on the chosen value.

The temporal coherence length L of the laser 104 is defined by $\lambda^2/\Delta\lambda$, where $\Delta\lambda$ is the spectral range of the radiation and $\lambda$ is the central wavelength of the laser 104. As an example, wavelength's used in typical excimer lasers for microlithography are 248, 193, and 157 nm. Spectral range of radiation varies depending on the design of the lithographic tool and laser. The spectral range of radiation can be as small as 1 pm and as broad as 100 pm. Thus, the range of coherence lengths L can be from 0.25 mm to 40 mm.

The side of the width a used for calculations is based on which side of the laser beam 204 needs to be expanded. In one example of ranges for the different parameters a light beam can be 5 mm×20 mm. Hence, the width a is 5 mm and is expanded four times. In other embodiments, expansion of width a can be 4 to 6 times. In this example the temporal coherence length L is 20 mm, although L varies depending on spectral range, and the incident angle $\alpha$ is 10° (degrees). Thus, in this example, d=5 mm/2*sin10=14.4 mm and b=14.4 mm*tan(10)=2.54 mm.

In operation of the embodiment shown in FIG. 2A, the light 102 emitted by the laser 104 is received at a predetermined angle $\alpha$ at the first beam splitter 204 that reflects a first portion of the light 102 toward the reflector 200 and transmits a second portion of the light toward the second beam splitter 206. The reflector 200 receives the first portion of the light 102 and reflects a third portion of the light 102 toward the second beam splitter 204. The second portion of the light 102 is received at the second beam splitter 206, which reflects a fourth portion of the light 102 toward the reflector 200 and transmits a fifth portion of the light 102 to produce a first output beam 212. The third portion of the light 102 is received at the second beam splitter 206, which reflects a sixth portion of the light 102 toward the reflector 200 and transmits a seventh portion of the light 102 to produce a second output beam 214. The reflector 200 receives the fourth portion of the light 102 and reflects an eighth portion of the light 102 to produce a third output beam 216. Finally, the reflector receives the seventh portion of the light 102 and reflects a ninth portion of the light 102 to produce a fourth output beam 218. The first through fourth output beams 212–218 can be equal in intensity, and are about 25% the intensity of the input beam 102. One way this can be done is using 50/50 beam splitters.

Figure 2B:
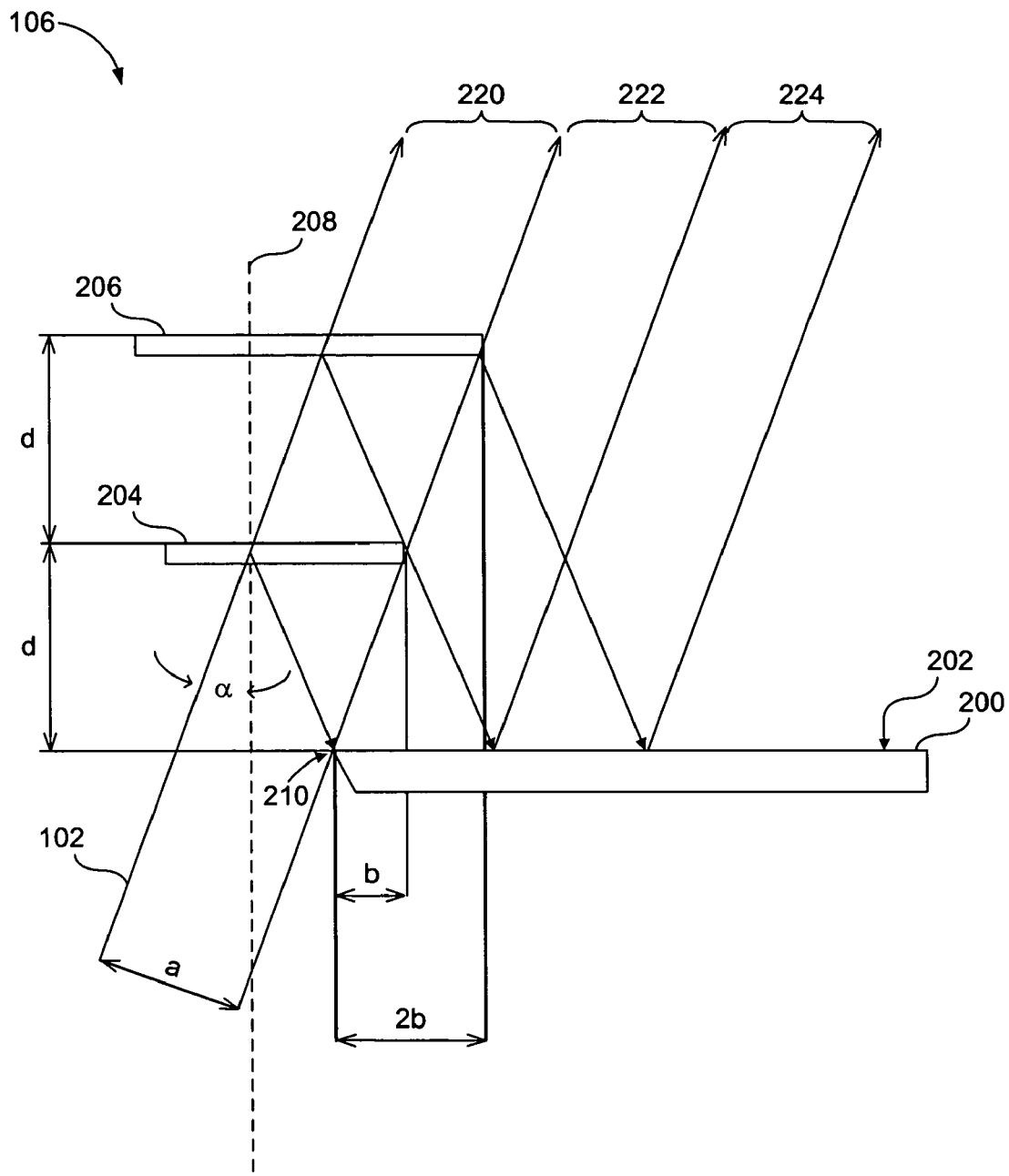

As seen in FIG. 2B, another embodiment of the present invention includes the second beam splitter 206 being laterally shifted by 2b relatively to an edge 210 of the reflector 200 instead of the 4b lateral shift in FIG. 2A. Through this arrangement of moving the second beam splitter 206 2b, the third beam of light only generates the second output 222 instead of being partially reflected and partially transmitted. Otherwise, similar to the light travel above, three output beams 220, 222, and 224 with about the same intensity are produced. The intensity of the output beams 220, 222, and 224 can be maintained through the use of a 66:33 beam splitter 204 and a 50:50 beam splitter 206.

Figure 3:
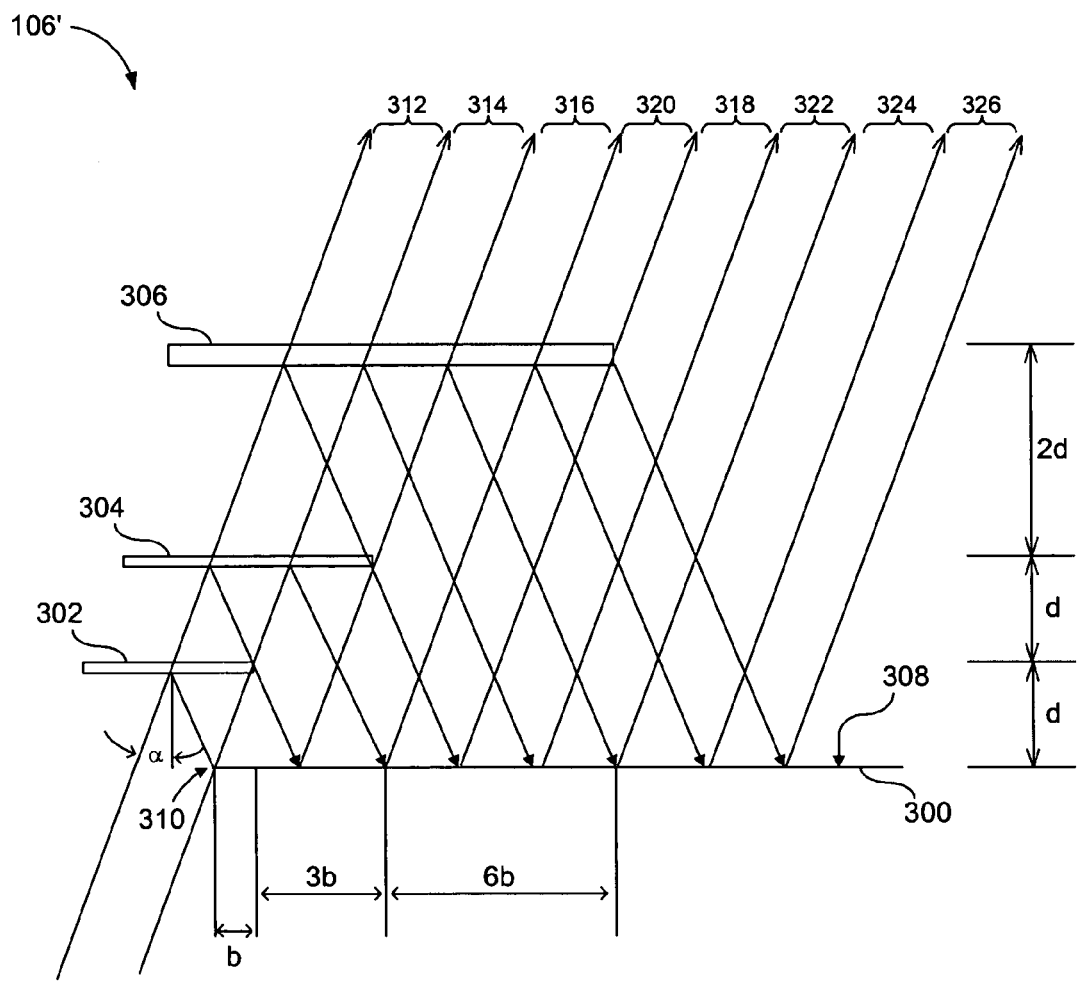
FIG. 3 depicts optical multiplexer elements and light travel within a portion of the optical system in FIG. 1, according to an embodiment of the present invention.

With reference now to FIG. 3, another embodiment of the multiplexer 106' is shown. In this embodiment, the multiplexer comprises a reflector 300 and first, second, and third beam splitters 302, 304, and 306, which can be 50/50 beam splitters. The relationship of the beam splitter parameters d, b, $\alpha$, and L are as described above. In this embodiment, the first beam splitter 302 is spaced a distance d away from a plane extending from a reflecting surface 308, the second beam splitter 304 is spaced a distance 2d, and the third beam splitter 306 is spaced a distance 4d. Also, the first beam splitter 302 is laterally shifted a distance b from an edge 310 of the reflector 300, while the second beam splitter 304 is laterally shifted a distance 4b and the third beam splitter is laterally shifted a distance 10b.

In operation of the embodiment shown in FIG. 3, the light 102 is received at a predetermined angle $\alpha$ at the first beam splitter 302 that reflects a first portion of the light 102 toward the reflector 300 and transmits a second portion of the light 102 toward the second beam splitter 304. The second beam splitter 304 reflects a third portion of the light 102 toward the reflector 300 and transmits a fourth portion of the light 102 toward a third beam splitter 306. The first portion of the light 102 received at the reflector 300 is reflected as a fifth portion of the light 102 toward the second beam splitter 304. The beam splitter 304 reflects a sixth portion of the light 102 toward the reflector 300 and transmits a seventh portion of the light 102 toward the third beam splitter 306. The third portion of the light 102 is received at the reflector 300 and reflected as an eighth portion of the light 102 toward the third beam splitter 306. The fourth portion of the light 102 is received at the third beam splitter 306 and reflected as a ninth portion of the light 102 toward the reflector 300. The third beam splitter 306 transmits a tenth portion of the light 12 to produce a first output beam 312.

The reflector 300 receives the sixth portion of the light 102 and reflects an eleventh portion of the light 102 toward the third beam splitter 306. The third beam splitter 306 receives the seventh portion of the light 102 and reflects a twelfth portion of the light 102 toward the reflector 300 and transmits a thirteenth portion of the light 102 to produce a second output beam 314. The third beam splitter 306 receives the eighth portion of the light 102 and reflects a fourteenth portion of the light toward the reflector 300 and transmits a fifteenth portion of the light to produce a third output beam 316.

The ninth portion of the light 102 is received by the reflector 300 that reflects a sixteenth portion of the light 102 to produce a fourth output beam 318. The eleventh portion of the light 102 is received at the third beam splitter 306 and reflected as a seventeenth portion of the light 102 toward the reflector 300 and transmitted as an eighteenth portion of the light 102 to produce a fifth output beam 320. The twelfth portion of the light 102 is received at the reflector 300 and reflected as a nineteenth portion of the light 102 to produce a sixth output beam 322. The reflector 300 receives the fourteenth portion of the light 102 and reflects a twentieth portion of the light 102 to produce a seventh output beam 324. Finally, the reflector 300 receives the seventeenth portion of the light 102 and reflects a twenty first portion of the light 102 to produce an eighth output beam 326. Therefore, through the arrangement shown in FIG. 3, eight output beams 312–326 are produced each having approximately 1/8 the total intensity as the input beam 102.

Although not shown for convenience, it is to be appreciated that other embodiments of the present invention can be generalized for $2^N$ times expansion or multiplexing of the light 102 from the laser 104. This expansion of the light 102 is also called "multiplexing". The number of beam splitters, which can be 50/50 beam splitters or any other required for the embodiment, in each subsequent case must be equal to N. The angle $\alpha$ of the light beam 102 relative to the first beam splitter in a general case is defined by equation (2) above. The beam splitters are numbered starting with the closest one to a reflector: 1, 2, ... k, ... N. A distance of the first beam splitter from the reflector is d, where d is defined by equation (1) above. The k-th beam splitter is positioned at a distance (k−1)*d from a preceding beam splitter. Also, the first beam splitter is shifted laterally relatively to an edge of the reflector by b, where b is defined by equation (3) above. The k-th beam splitter is laterally shifted relative to the preceding beam splitter by (k−1)*3b.

In other embodiments, the ratio of reflection to transmission in the beam splitters can be altered slightly to account for light loss within the system 100. This is to compensate for absorption in material of the beam splitter, less than desired reflectivity, and scattering of light. Further, the beam splitters are a predetermined thickness so that the lateral shift of the beam 102 inside the beam splitter body due to refraction is minimized. In lithography applications, for example, the predetermined thickness is between 1 mm and 3 mm. However, other thickness values can be used for other implementations of the present invention without departing from the scope of the present invention.

Figure 4:
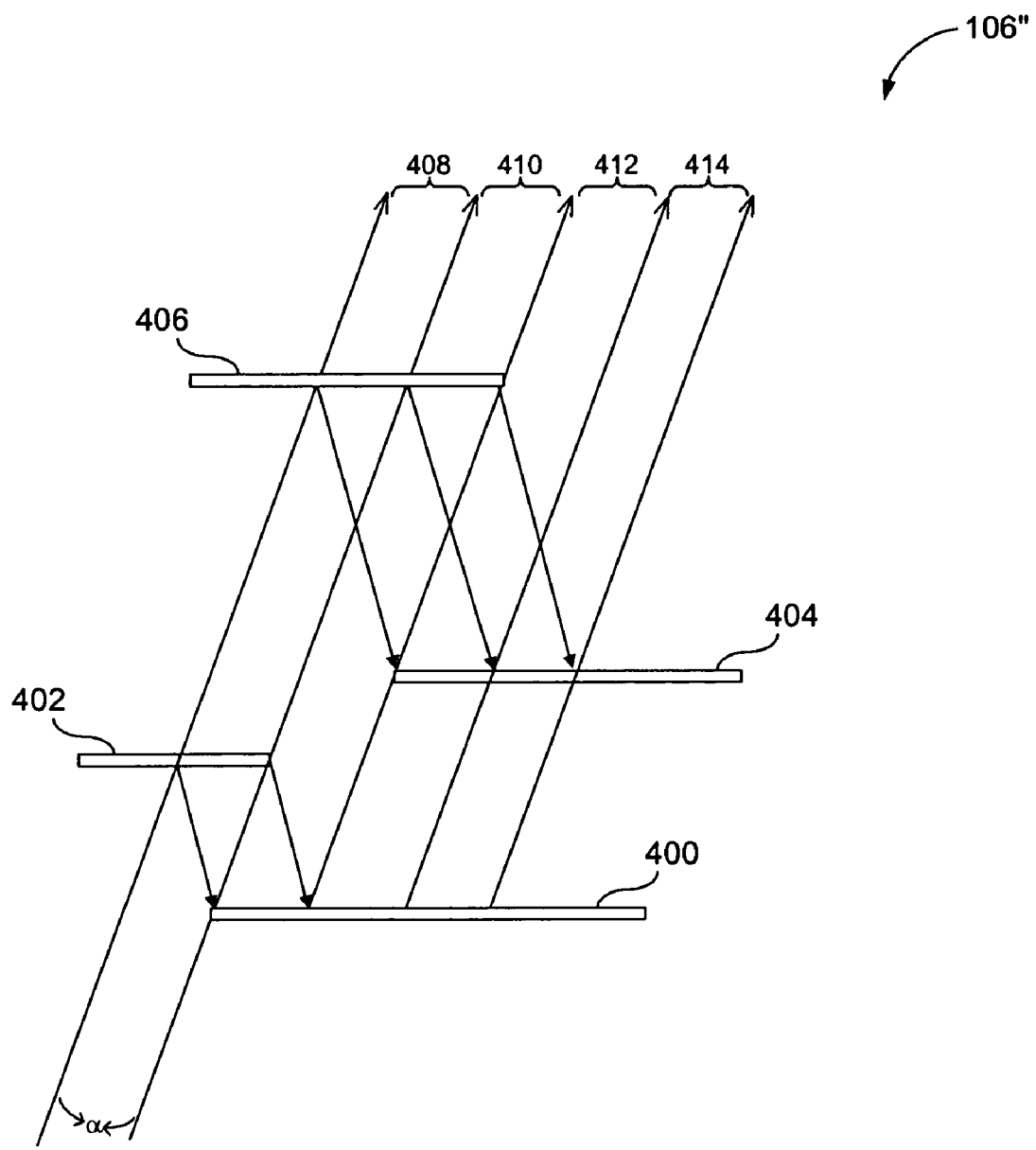
FIG. 4 depicts optical multiplexer elements and light travel within a portion of the optical system in FIG. 1, according to an embodiment of the present invention.

Now with reference to FIG. 4, another embodiment of the multiplexer 106" is shown. This multiplexer 106" generates N times expansion of the light beam 102, as compared to $2^N$ times expansion of the light beam 102 in the embodiments discussed above. The multiplexer 106" comprises, in parallel, a first reflector 400, a first beam splitter 402, a second reflector 404, and a second beam splitter 406. Determination of the spacing between the elements is similar to that as described above.

In operation, the light 102 is received at a predetermined angle $\alpha$ at a first beam splitter 402 that reflects a first portion of the light 102 toward a first reflector 400 and transmits a second portion of the light 102 toward a second beam splitter 406. The first portion of the light 102 received at the first reflector 400 is reflected as a third portion of the light 102 toward the second beam splitter 406. The second portion of the light 102 is received at the second beam splitter 406 and reflected as a fourth portion of the light 102 toward a second reflector 404 and transmitted as a fifth portion of the light 102 to produce a first output beam 408. The second beam splitter 406 receives the third portion of the light 102 and reflects a sixth portion of the light 102 toward the second reflector 404 and transmits a seventh portion of the light 102 to produce a second output beam 410. The fourth portion of the light 102 is received at the second reflector 404 and reflected as an eighth portion of the light 102 to produce a third output beam 412. Finally, the sixth portion of the light is received at the second reflector 404 and reflected as a ninth portion of the light to produce a fourth output beam 414. Each of said output beams 408–414 will have an intensity of about 25% of the incident beam 102.

Figure 5:
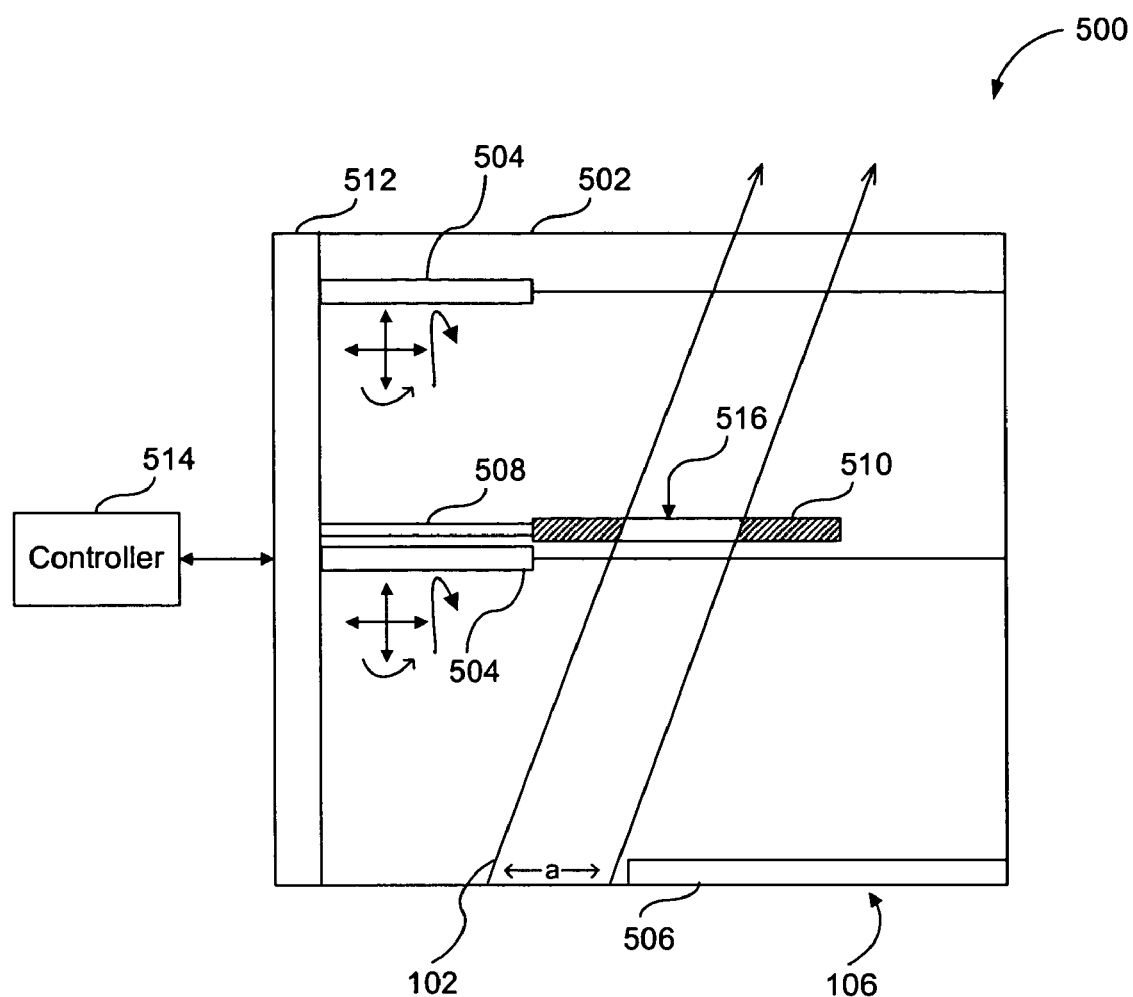
FIG. 5 depicts an adjustment system and multiplexer elements within a portion of the optical system in FIG. 1, according to an embodiment of the present invention.

Turning to FIG. 5, an adjusting system 500 for a multiplexer 106 is shown. Merely as an example, a two beam splitter multiplexer 106, similar to that shown in FIG. 2, can be the environment for the adjusting system 500. In this system 500, the multiplexer 106 is secured in a housing 502 that has beam splitter securing devices 504, a reflector securing device 506, and a detector securing device 508 for a detector 510. In some embodiments, detection 510 can be a sectional detector (e.g., a quad detector) that more precisely determines characteristics of a detected beam. An adjustment device 512 is coupled to the securing devices 504, 506, and 508. The adjustment device 512 is also coupled to a controller 514 that controls adjustment of the securing devices 504, 506, and 508, with three degrees of freedom as shown by the arrows, based on signals received from the detector 510.

In operation, the detector 510 generates a signal when the light 102 from the laser 104 falls outside of a non-detection area 516, which can result either from misalignment of the laser 104 or a distorted beam 102. The non-detection area 516 can be a width a of the light 102. When this signal from the detector 510 is received at the controller 514, the controller 514 sends a control signal to the adjustment device 512 to adjust the positioning of the beam splitters using the beam splitter securing devices 504. As described above, the beam splitter securing devices 504 can adjust the beam splitters in three degrees, as is shown by the arrows. Once adjusted, the light beam 102 again transmits through only the non-detection area 516 of the detector 510, which ensures that the multiplexer 106 will accurately produce expanded light beams. As can be appreciated, the adjusting system 500 can be modified to accommodate any number of beam splitters and reflectors.

It is to be appreciated that the adjustment of the beam splitters or other elements within the multiplexer 106 can be done manually. In that embodiment, a user would be alerted, based either on a detector or through visual determination, that the light 102 is reaching areas of the multiplexer outside of a predetermined area. Then, the user would make mechanical adjustments to re-align the light beam 102.

CONCLUSION

Example embodiments of the present invention have been described herein. As noted elsewhere, these example embodiments have been described for illustrative purposes only, and are not limiting. Other embodiments are possible and are covered by the invention. Such embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalence.

What is claimed is:

1. A multiplexer located in a beam conditioner in a lithography system, the multiplexer comprising:

a mirror; and first and second spatially separated beam splitters positioned on a same side of and parallel to the mirror to expand a continuous beam of light emitted by a laser source into a plurality of continuous beams having light intensity substantially equal to each other without changing a spatial coherence of the light emitted by the laser, the beam being received by illumination optics in the lithography system, wherein a plane of the first beam splitter is located parallel to and a distance d from a plane extending from a reflecting surface of the mirror, wherein $d=a/(2*\sin \alpha)$, a is a width of the light emitted by the laser source, L is a temporal coherence length of the light, and $\alpha$ is an illumination angle of the light with respect to the first beam splitter, wherein a plane of the second beam splitter is located parallel to and a distance 2d apart from the plane of the mirror, wherein an edge of the first beam splitter is laterally shifted a distance b with to respect to a section of the mirror, wherein $b=d*\tan \alpha$, and wherein an edge of the second beam splitter is laterally shifted a distance 2b with respect to the section of the mirror.

2. The system of claim 1, further comprising:

a detector positioned proximate the first beam splitter, the detector detecting light falling outside of a predetermined area of the first beam splitter.

3. The system of claim 1, further comprising:

a housing including individual securing devices that individually secure the reflector and each of the first and second beam splitters.

4. The system of claim 3, wherein the housing further comprises:

a detector positioned in from of the first beam splitter; and an adjustment device that permits individual adjustment of each of the individual securing devices based on signals from the detector.

5. A multiplexer located in a beam conditioner in a lithography system, the multiplexer comprising:

a mirror; and first, second, and third spatially separated beam splitters positioned on a same side of and parallel to the mirror to expand a continuous beam of light emitted by a continuous laser source into a plurality of continuous beams having light intensity substantially equal to each other without changing a spatial coherence of the light emitted by the laser, the beam being received by illumination optics in the lithography system, wherein a plane of the first beam splitter is located parallel to and a distance d from a plane extending from a reflecting surface of the mirror, wherein $d=a/(2*\sin \alpha)$, a is a width of the light emitted by the laser source, L is a temporal coherence length of the light, and a is an illumination angle of the light with respect to the first beam splitter, wherein a plane the second beam splitter is located parallel to and a distance 2d from the plane of the mirror, wherein a plane of the third beam splitter is located parallel to and a distance 4d from the plane of the mirror, wherein an edge of the first beam splitter is laterally shifted a distance b with respect to a section of the mirror, wherein $b=d*\tan \alpha$, wherein an edge of the second beam splitter is laterally shifted a distance 4b with respect to the section of the mirror, and wherein an edge of the third beam splitter is laterally shifted a distance 10b with respect to the section of the mirror.

6. The system of claim 5, further comprising:

a detector positioned proximate the first beam splitter, the detector detecting light falling outside of a predetermined area of the first beam splitter.

7. The system of claim 5, further comprising:

a housing having individual securing devices that individually secure the reflector and each of the first, second, and third beam splitters.

8. The system of claim 7, wherein the housing further comprises:

a detector positioned in front of the first beam splitter; and an adjustment device that permits individual adjustment of each of the individual securing devices based on signals from the detector positioned.

* * * * *

UNITED STATES PATENT AND TRADEMARK OFFICE
CERTIFICATE OF CORRECTION

PATENT NO. : 7,027,129 B2
APPLICATION NO. : 10/947347
DATED : April 11, 2006
INVENTOR(S) : Kremer et al.

Page 1 of 1

It is certified that error appears in the above-identified patent and that said Letters Patent is hereby corrected as shown below:

Column 7, line 42, "from" should be replaced with --front--.
Column 8, line 14, "and a is" should be replaced with --and α is--.
Column 8, line 17, "plane the" should be replaced with --plane of the--.

Signed and Sealed this

Eighth Day of August, 2006

JON W. DUDAS
*Director of the United States Patent and Trademark Office*